(12) United States Patent
Vanhoucke et al.

(10) Patent No.: US 9,240,468 B2
(45) Date of Patent: Jan. 19, 2016

(54) BIPOLAR TRANSISTOR HAVING LATERALLY EXTENDING COLLECTOR

(71) Applicant: NXP B.V., Eindhoven (NL)

(72) Inventors: Tony Vanhoucke, Bierbeek (BE); Viet Thanh Dinh, Heverlee (BE); Anco Heringa, Waalre (NL); Dirk Klaassen, Waalre (NL); Evelyne Gridelet, Omal (BE); Jan Willem Slotboom, Eersel (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/223,296

(22) Filed: Mar. 24, 2014

(65) Prior Publication Data
US 2014/0312356 A1      Oct. 23, 2014

(30) Foreign Application Priority Data

Mar. 25, 2013   (EP) .................................... 13160864

(51) Int. Cl.
| | | |
|---|---|---|
| *H01L 29/15* | (2006.01) | |
| *H01L 31/0256* | (2006.01) | |
| *H01L 29/737* | (2006.01) | |
| *H01L 29/40* | (2006.01) | |
| *H01L 29/66* | (2006.01) | |
| *H01L 29/732* | (2006.01) | |
| *H01L 29/08* | (2006.01) | |
| *H01L 29/739* | (2006.01) | |

(Continued)

(52) U.S. Cl.
CPC .......... *H01L 29/737* (2013.01); *H01L 29/0821* (2013.01); *H01L 29/402* (2013.01); *H01L 29/6628* (2013.01); *H01L 29/66242* (2013.01); *H01L 29/739* (2013.01); *H01L 29/7327* (2013.01); *H01L 29/0649* (2013.01); *H01L 29/0692* (2013.01); *H01L 29/1004* (2013.01); *H01L 29/205* (2013.01); *H01L 29/407* (2013.01)

(58) Field of Classification Search
CPC . H01L 29/7325; H01L 29/73; H01L 29/7317; H01L 29/7375; H01L 21/8249; H01L 27/0823; H01L 27/2445; H01L 29/0821; H01L 29/1033; H01L 29/66234; H01L 29/66242
See application file for complete search history.

(56) References Cited

U.S. PATENT DOCUMENTS

| | | | | |
|---|---|---|---|---|
| 5,321,302 A | * | 6/1994 | Shimawaki | 257/592 |
| 5,406,113 A | * | 4/1995 | Horie | 257/565 |

(Continued)

FOREIGN PATENT DOCUMENTS

| | | |
|---|---|---|
| EP | 0 039 015 A2 | 11/1981 |
| JP | S60 20569 A | 2/1985 |
| JP | 2000 349090 A | 12/2000 |

OTHER PUBLICATIONS

Kuppas, P., et al.; "Gainas/Inp I2L Ring Oscillators"; Electronics Letters, IEE Stevenage, GB, vol. 25, No. 15; pp. 998-999 (Jul. 20, 1989).

(Continued)

*Primary Examiner* — Thanh Y Tran (57) ABSTRACT

A semiconductor device and a method of making the same. The device includes a semiconductor substrate. The device also includes a bipolar transistor on the semiconductor substrate. The bipolar transistor includes an emitter. The bipolar transistor also includes a base located above the emitter. The bipolar transistor further includes a laterally extending collector located above the base. The collector includes a portion that extends past an edge of the base.

20 Claims, 6 Drawing Sheets

(51) Int. Cl.
H01L 29/06 (2006.01)
H01L 29/10 (2006.01)
H01L 29/205 (2006.01)

(56) References Cited

U.S. PATENT DOCUMENTS

| | | | | |
|---|---|---|---|---|
| 5,846,867 | A * | 12/1998 | Gomi et al. | 438/318 |
| 6,525,388 | B1 * | 2/2003 | Shimawaki | 257/477 |
| 2004/0262715 | A1 * | 12/2004 | Miura et al. | 257/565 |
| 2007/0019339 | A1 * | 1/2007 | Gill | 360/324.2 |
| 2008/0310467 | A1 * | 12/2008 | Feng et al. | 372/30 |
| 2014/0117493 | A1 * | 5/2014 | Cheng et al. | 257/526 |
| 2014/0167116 | A1 * | 6/2014 | Chevalier et al. | 257/197 |

OTHER PUBLICATIONS

Mertens, H., et al.; "Double-Polysilicon Self-Aligned SiGe HBT Architecture Based on Non selective Epitaxy and Polysilicon Reflow"; IEEE; 2012 IEEE Bipolar/BiCMOS Circuits and Technology Meeting; 4 pages. (Sep. 30-Oct. 3, 2012).

Sun, I-Shan, et al; "A Novel SOI Lateral Transistor with 30 GHz $f_{max}$ and 27V $BV_{CEO}$ for RF Power Amplifier Applications"; Proceedings of the 17 Int'l Symposium on Power Semiconductor Devices & ICs, Santa Barbara, CA, USA; 4 pages (May 23-26, 2005).

Henkel, A., et al.; "Single and Double Heterojunction Bipolar Transistors in Collector-up Topology"; GAAS 98 Amsterdam 1998; pp. 703-708; retrieved from the internet Mar. 12, 2014 http://amsacta.unibo.it/1668/1/GAAS_98_124.pdf (1998).

Gruhle, Andreas, et al.; "Collector-Up SiGe Heterojunction Bipolar Transistors"; IEEE Transactions on Electron Devices, vol. 46, No. 7; pp. 1510-1513 (Jul. 1999).

Choi, L.J., et al.; "A Novel Isolation Scheme featuring Cavities in the Collector for a High-Speed 0.13 µm SiGe: C BiCMOS Technology"; Topical Meeting on Silicon Monolithic Integrated Circuits in RF Systems, Long Beach, CA, USA; pp. 158-161 (Jan. 10-12, 2007).

Liu, Q.Z., et al; "Collector Optimization in Advanced SiGe HBT Technologies"; 2005 IEEE Compound Semiconductor Integrated Circuit Symposium; pp. 117-120 (Oct. 30-Nov. 2, 2005).

Extended European Search Report for application No. 13160864.8 (Aug. 13, 2012).

* cited by examiner

BIPOLAR TRANSISTOR HAVING LATERALLY EXTENDING COLLECTOR

CROSS-REFERENCE TO RELATED APPLICATIONS

This application claims the priority under 35 U.S.C. §119 of European patent application no. 13160864.8, filed on Mar. 25, 2013, the contents of which are incorporated by reference herein.

BACKGROUND OF THE INVENTION

This invention relates to a semiconductor device. In particular, this invention relates to a semiconductor device comprising a semiconductor substrate and a bipolar transistor on the semiconductor substrate.

In the field of data communications, there is an ongoing need for power amplifiers that are able to operate at high speed. Systems of this kind typically use power amplifiers at the transmitter side to enable them to transfer the data from the circuit to the open field by electro-magnetic radiation. These high-frequency power amplifiers are designed to work at high currents and/or high voltages in order to transmit sufficient power.

Although CMOS based technologies can be used to produce high power output power amplifiers, bipolar technologies remain important for providing high-efficiency, high power amplifiers at (ultra-) high frequencies. There is often a trade-off in bipolar devices between high power performance, high frequency performance and cost.

For bipolar technologies, high currents can be obtained with large-area transistors, while the breakdown voltage of the device largely determines the maximum voltage swing during operation. Optimal RF performance (e.g. maximum oscillation frequency, $f_{MAX}$) however, can only be obtained with narrow emitter transistors such that the intrinsic base resistance is minimal. Therefore, long "finger"-like transistor shapes are often used to increase the transistor area, transistor current and corresponding output power. It is common practice now to divide the active area into several emitter fingers in order to spread the total current of the transistor across more area.

Figure 1A:
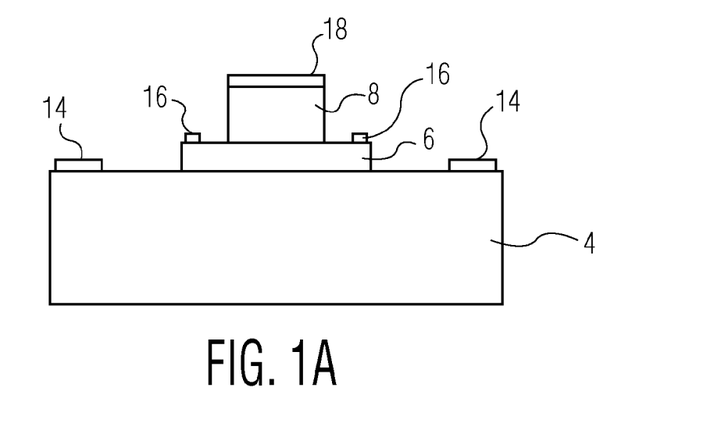
FIG. 1A schematically illustrates a bipolar transistor.

FIG. 1A schematically illustrates an example of bipolar transistor as is known in the art. The transistor includes a collector 4, a base 6 and an emitter 8. The base 6 is located on (above) the collector 4 (which may, for example, be buried in a semiconductor substrate upon which the device is located), and in turn the emitter 8 is located on (above) the base 6. The collector 4, base 6 and emitter 8 are each provided with respective contacts 14, 16 and 18 for making electrical connection thereto.

In devices of this kind, the maximum oscillation frequency figure of merit $f_{MAX}$ is dominated by two factors, namely the base resistance ($R_B$) and collector-base capacitance ($C_{BC}$), as can be seen from the simplified formula:

$$f_{MAX} \propto \sqrt{f_T / C_{BC} R_B} \qquad (1)$$

where $f_T$ is the cut off frequency (see "A Novel SOI Lateral Bipolar Transistor with 30 GHz $f_{MAX}$ and 27V BVCEO for RF Power Amplifier Applications", Proceedings of the 17th International Symposium on Power Semiconductor Devices & IC's, May 23-26, 2005, Santa Barbara, Calif.).

Measures to improve $f_{MAX}$ of a bipolar transistor include the reduction of $R_B$ (both intrinsic and extrinsic) by increasing the doping level in the base or by modifying the extrinsic base region. However, increasing the doping level in the intrinsic base can result in a lower collector current and can consequently lower $f_T$.

Another approach to improve $f_{MAX}$ involves attempting to reduce the collector-base capacitance $C_{BC}$. In the past, these efforts have included changing the device architecture or by reducing overlays (e.g. using better lithographic techniques).

One particular approach to reducing $C_{BC}$ has included inverting the design of the transistor (with respect to the schematic example shown in FIG. 1A) to produce a so called "bottom-up transistor" (see, for example, "Single and Double Heterojunction Bipolar Transistors in Collector-up Topology", A. Henkel et al., GAAS 98, Amsterdam, and "Collector-up SiGe Heterojunction Bipolar Transistors", A. Gruhle et al., IEEE Transactions on Electron Devices, vol. 46, No. 7, July 1999).

Figure 1B:
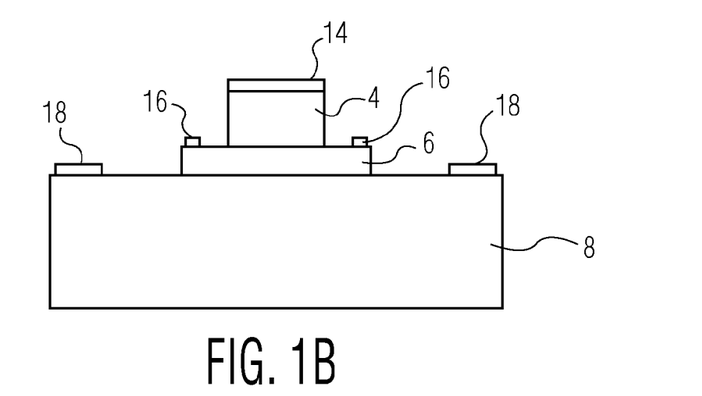
FIG. 1B schematically illustrates a "bottom-up" bipolar transistor.

A schematic of a bottom-up bipolar transistor is illustrated in FIG. 1B. As in the example of FIG. 1A, the transistor includes a collector 4, a base 6 and an emitter 8. Again, the collector 4, base 6 and emitter 8 are each provided with respective contacts 14, 16 and 18 for making electrical connection thereto. However, in the bottom-up topology, the base 6 is located on (above) the emitter 8, while the collector 4 is located on (above) the base 6.

By comparison of FIGS. 1A and 1B, it can be seen that in the bottom-up approach, the contact area between the collector 4 and the base 6 is relatively small as compared to the more conventional design in which the base-collector contact area is defined by the area of the base 6. This results in a smaller collector-base capacitance $C_{BC}$.

Conversely, the contact area between the base 6 and the emitter 8 in FIG. 1B is relatively large. Hence, the reduction in collector-base capacitance comes at a cost, namely an increased base emitter capacitance $C_{BE}$, which in turn lowers $f_T$ performance hampering the overall effort to improve $f_{MAX}$ (equation 1).

Accordingly, the bottom-up bipolar transistor concept may allow improvements in $f_{MAX}$ (it is thought the benefit from reduced $C_{BC}$ can outweigh the effects of an increased $C_{BE}$). Embodiments of this invention can further improve upon the performance of a bipolar transistor in which the base is located above the emitter and the collector is located above the base.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device. The device includes a semiconductor substrate. The device also includes a bipolar transistor on the semiconductor substrate. The bipolar transistor includes an emitter. The bipolar transistor also includes a base located above the emitter. The bipolar transistor further includes a laterally extending collector located above the base. The collector includes a portion that extends past an edge of the base.

According to another aspect of the invention, there is provided a method of making a semiconductor device. The method includes providing a semiconductor substrate. The method also includes forming a bipolar transistor on the substrate by: forming an emitter of the bipolar transistor; forming a base located above the emitter, and forming a laterally extending collector located above the base, wherein the collector includes a portion that extends past an edge of the base.

In a bottom-up bipolar transistor in which the base is located above the emitter and the collector is located above the base, the provision of a laterally extending collector having a portion that extends past an edge of the base allows the field in the collector to be distributed over a wider area. This improves the breakdown performance of the device.

Although the use of lateral collectors is known in the bulk (i.e. in conventional devices (e.g. FIG. 1A)) where the collector may be buried in the substrate, the inventors have realised that a lateral collector can be employed in alternative topologies to afford at least some of the numerous advantages noted herein. In particular, it is for the first time proposed that a lateral collector can be used in a bottom-up bipolar transistor in which the base is located above the emitter and the collector is located above the base.

In a bottom-up bipolar transistor, since the collector is located above the base, in contrast to conventional designs in which the collector is simply buried in the substrate, a considerable degree of flexibility as regards device layout becomes available. For example, the particular shape and configuration of the collector (e.g. lateral extent and degree of overlap of the collector with the base) can be tailored to the required characteristics (e.g. breakdown performance) of the device. Device designers can thus specify the layout of the device (particularly the lateral collector) to meet specific application requirements in a manner that does not affect the overall number of processing steps needed for manufacture.

In some embodiments, a dielectric can be located between the portion of the collector that extends past an edge of the base and the emitter. This dielectric (which may be provided in the form of a layer) can act to prevent short circuiting of the emitter and collector, while also providing a degree of mechanical stability for the collector.

The device can have a layered construction, which lends itself to manufacture using standard front end of line (FEOL) processing steps. Thus, the base can be provided as a patterned layer of semiconductor material located on the emitter, and/or the collector can include a patterned layer of semiconductor material located on the base.

The emitter can be provided as a buried emitter. As such, the emitter can be formed in the bulk, or could alternatively be provided as a buried layer in the substrate. In alternative constructions, the emitter could be provided as a layer on a major surface of the substrate.

In some examples, one or more dielectric filled cavities, such as trenches, can be located in the emitter for reducing the base-emitter capacitance of the bipolar transistor, thereby enhancing the RF performance of the device.

In accordance with some embodiments, a gate can be located on the collector for shaping an electric field in the collector. The gate can include a gate electrode isolated from the collector by a dielectric. In some examples, the gate can include a stack of layers including one or more isolating dielectric layers on top of which one or more layers of gate electrode material are provided. Application of a potential to the gate can, through shaping of the electric field in the collector, thus allow higher breakdown voltages to be achieved.

The lowering of the electric field within the collector in this way can allow the traditional trade-off between breakdown voltage and cut off frequency $f_T$ to be improved upon, compared to conventional devices. In conventional devices, it is known to attempt to increase the peak cut off frequency $f_T$ by increasing the doping levels in the collector. However, this increase in the doping level has the adverse effect of lowering the collector breakdown voltage. In accordance with embodiments of the invention, the doping level in the collector can be increased to improve the peak cut off frequency $f_T$, while counteracting the theoretical lowering of the breakdown voltage by suppressing the peak electric field in the collector by the application of a potential to the collector gate.

It is noted that since the collector is provided above the base and the emitter, the collector is made readily accessible for the placing of such a gate. The gate can be positioned to optimise the field shaping effect. For example, the gate can be located at an end of the laterally extending collector, proximal the base.

For the purposes of the present application, embodiments in which the semiconductor device comprises a gate located on the collector are referred to as bipolar transistors, despite the fact that, strictly speaking, field effects are utilised. The skilled person will appreciate that examples of this kind can be viewed as modified bipolar transistors that operate fundamentally in bipolar mode, with the additional enhancements afforded by the presence of the gate.

The gate can be at least partially enclosed within the collector. By locating the gate within the collector, the influence of the gate on the electric field internal the collector can be increased. Analogously, the gate can at least partially cover more than one surface of the collector. Increasing the overlap area between the gate and the collector can also enhance the field shaping ability of the gate. In some examples, the gate can at least partially cover an upper surface and one or more sidewalls of the collector. Again, it is noted this kind of gate configuration is made possible by the fact that the collector can be provided toward the top of the device, whereby it can be readily accessible in more than one dimension for placement of a gate.

A collector contact can be provided at an end of the laterally extending collector distal the base.

In one embodiment, a base contact portion can be provided that at least partially covers each of an upper surface and one or more sidewalls of the base. The contact area to the base can thereby be maximised, reducing the base resistance (see equation 1).

In one embodiment, the bipolar transistor can be a heterojunction bipolar transistor in which the collector comprises a different semiconductor material to the base. In some examples, the collector can comprise GaN, which can allow a high breakdown voltage. Other materials or combination of materials or layers could be used such as GaAs, lateral SiGe-layers or even vertical doping spikes in the collector.

It is noted that since the collector is located above the base, a different material can readily be selected for use in the collector without the need to substantially alter the design of the rest of the device or the process steps used to produce it. In contrast, in conventional bipolar transistors in which the collector is located at the bottom of the device (e.g. it is formed in the substrate), changing the material used for the collector has wide ranging implications for the overall design. Nevertheless, it is also envisaged that in some examples of the invention, a heterojunction can be formed at the emitter-base interface (i.e. the material of the base is different to that of the emitter).

According to a further aspect of the invention, there is provided a power amplifier including a device of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 2:
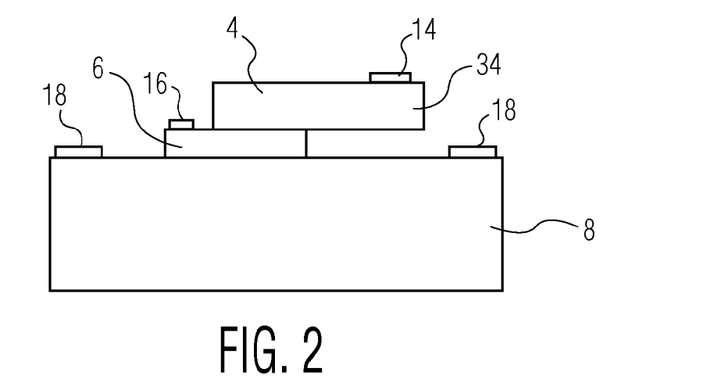
FIG. 2 shows a semiconductor device including a bipolar transistor according to an embodiment of the invention.

FIG. 2 schematically illustrates a semiconductor device according to a first embodiment of the invention. The device includes a semiconductor substrate. The device also includes a bipolar transistor having an emitter 8, a base 6 and a collector 4. In this embodiment, the emitter 8 is formed in the bulk of the substrate. It is envisaged that the emitter 8 may also be formed as a layer above the surface of the substrate.

The base 6 is provided as a layer of semiconductor material over the emitter 8. The layer forming the base 6 can be deposited and patterned using standard lithographic techniques, to provide the desired dimensions and alignment with respect to the emitter 8. The collector 4 can also be provided as a patterned layer of semiconductor material, dimensioned and aligned with respect to the base as desired.

In FIG. 2 it is shown that the collector 4 extends laterally. In the present embodiment, the collector 4 extends in a plane substantially parallel to the major surface of the substrate. The laterally extending configuration of the collector 4 allows the local electric field within the collector 4 to be distributed over a relatively wide area. The peak (or peaks) in field strength within the collector 4 can, in this way, be reduced, thereby improving the breakdown voltage of the device while keeping the cut-off frequency $f_T$ substantially constant.

To produce the laterally extending configuration of the collector 4, the collector 4 overlaps the base 6 (thereby to make contact therewith), but also extends past an edge of the base 6 and away from the overlapping region. The examples shown in the figures of the present application show a single lateral extension of the collector. However, it is envisaged that the collector may include a plurality of lateral extensions, each extension including a collector contact and collector gate of kind described later below. In one example, the collector 4 can extend outwardly in two directions, forming a T-shaped device (wherein the two lateral extensions of the collector 4 form the bar of the "T"). In another example, the collector extensions can take the form of a plurality of fingers extending laterally from a central part.

As shown in FIG. 2, the portion of the collector 4 that extends past the edge of the base 6 can overhang the edge of the base. For correct operation of the device (i.e. to prevent a short circuit of the collector 4 and emitter 8), it is necessary to ensure that this portion of the collector 4 does not make contact with the emitter 8. Accordingly, as described below, in embodiments where the emitter 8 is located directly beneath the overhanging portion of the collector 4, a dielectric layer can be used to separate them (e.g. see the dielectric layer 20 in FIG. 3). In other examples, where isolation regions are used to delineate the edges of the emitter 8, the use of a separate dielectric layer to isolate the collector 4 from the emitter 8 may not be needed. In such examples, the portion of the collector 4 that extends past the edge of the base 6 can make contact with and be mechanically supported by the isolation regions (e.g. FIG. 9B). The collector 4 in such examples is substantially L-shaped in cross section.

Since the collector 4 is formed at the "top" of the device (i.e. above the emitter 8 and the base 6), the configuration of the collector 4 can be chosen with a relatively high degree of flexibility. For example, the shape of the collector is not limited by the need to incorporate it into a substrate. In cases where the collector 4 comprises a different material to that which forms the substrate (e.g. in the case of a heterojunction device as described later below), the fact that the collector material can be grown separately above the major surface of the substrate can considerably simplify the processing of the device. Moreover, since the collector can be formed using standard deposition techniques, and then patterned using standard lithographic techniques, it follows that there is considerable freedom in defining the thickness, shape and size of the collector (these considerations apply also to the formation of the base 6).

The emitter 8, base 6 and collector 4 can each be provided with corresponding emitter contact(s) 18, base contact(s) 16 and collector contact(s) 14. The configuration of the various contacts can, unless otherwise noted herein, be conventional. For example, suitable contact metals (or metal alloys) can be selected in accordance with the semiconductor materials used for the elements of the device to which they connect. As is well known in the art, the contacts can be connected to metal layers in an overlying metallization stack, in order to connect the device with other components on, or external to, the substrate.

In the present example, the emitter contacts 18 are located on an upper surface of the emitter 8 which, since the emitter is buried, corresponds to the major surface of the semiconductor substrate. The base contact(s) 16 can be located on parts of the base that are not themselves covered by the overlying collector 4. In the present example, the base contact 16 is located on an upper surface of the layer of semiconductor material forming the base 6. Alternative configurations, in which the base contacts connect to the exposed side walls of the base 6, are described in more detail below. The collector contact 14 is, in this example, located at an end of the collector 4 distal the base 6.

Figure 3:
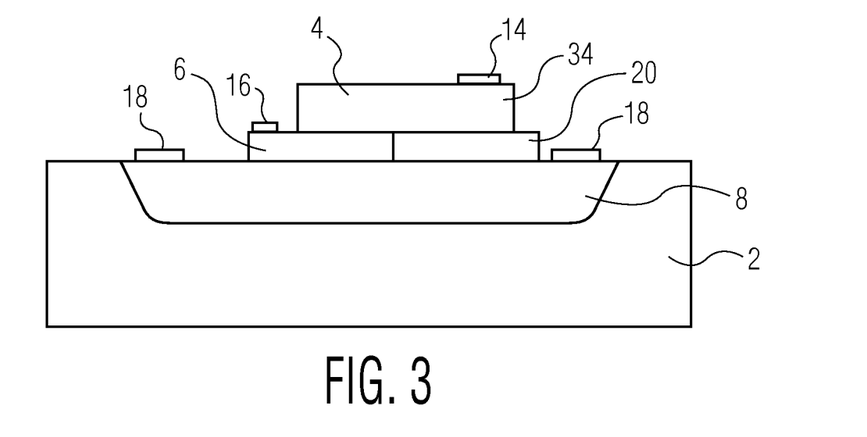
FIG. 3 shows a semiconductor device including a bipolar transistor according to another embodiment of the invention.

FIG. 3 illustrates a semiconductor device according to another embodiment of the invention. In this embodiment, the emitter 8 includes region of semiconductor material formed in an upper portion of a semiconductor substrate 2. The region forming the emitter 8 can be produced using, for example, an implantation process to introduce impurities into a well-like region adjoining the major surface of the substrate 2. In this way, the spatial extent of the emitter 8 can be controlled in accordance with the desired characteristics of the device.

This embodiment also includes the previously mentioned dielectric layer 20, which is located in-between the collector 4 (particularly, the portion of the collector 4 that extends past the edge of the base 6) and the emitter 8. This dielectric layer can be formed along with the base 6 using standard processing steps (e.g. lithographic, masking and thermal oxidation steps).

Figure 4:
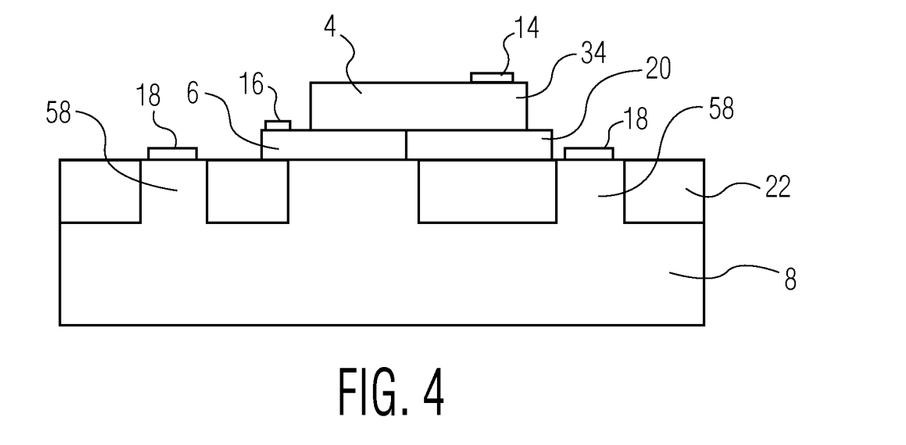
FIG. 4 shows a semiconductor device including a bipolar transistor according to a further embodiment of the invention.

FIG. 4 illustrates a semiconductor device according to a further embodiment of the invention. The construction of the device in this embodiment is similar to that shown in FIG. 3. However, in this embodiment, dielectric filled cavities 22 located in the emitter 8. Typically, these dielectric filled cavities 22 can take the form of trenches filled with oxide (e.g. Shallow Trench Isolation (STI)). The trenches can be formed by etching, and then filled with oxide prior to the processing of the remaining elements of the device including the layers forming the base 6 and collector 4. Where the emitter 8 includes a well-like region of the kind described above in relation to FIG. 3, the trenches can be located at least partly within the well. The purpose of the oxide filled cavities 22 is to control the spatial extent of the emitter 8, particularly where the emitter 8 meets the major surface of the substrate. Thus, the layout of the dielectric filled cavities 22 can be used to define the shape and size of the contact area between the emitter and the base, and also to form emitter contact sinks 58 where the emitter contacts 18 can be made. By closely controlling the contact area or overlap between the base 6 and the emitter 8, the base-emitter capacitance $C_{BE}$ can be set to an acceptable value.

Figure 5:
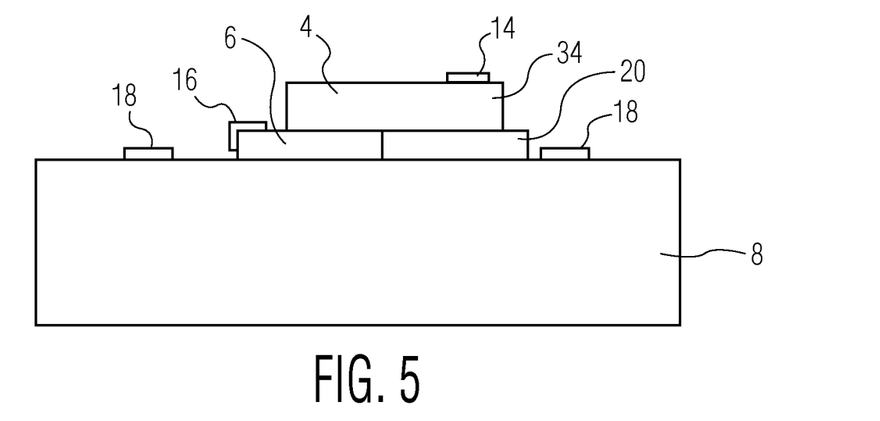
FIG. 5 shows a semiconductor device including a bipolar transistor according to another embodiment of the invention.

FIG. 5 illustrates a semiconductor device according to another embodiment of the invention. In this embodiment, the base contact 16 is configured to overlap with more than one surface of the base 6. The increased area of contact reduces the base resistance $R_B$, which can lead to an improvement in $f_{MAX}$ (see equation 1 above). In the present example, the base contact 16 overlaps an upper surface of the base 6, and also one or more side walls of the base 6. In the present example, it is shown that a single base contact 16 extends over more than one surface of the base 6. However, it is also envisaged for example that multiple contacts can be made to the base 6, each contact at least partially covering a respective surface of the base 6. The plurality of contacts can be interconnected at a separate location away from the base 6 itself. Similar considerations apply to the collector contact(s) described herein (and also to the collector gates described below).

Figure 6:
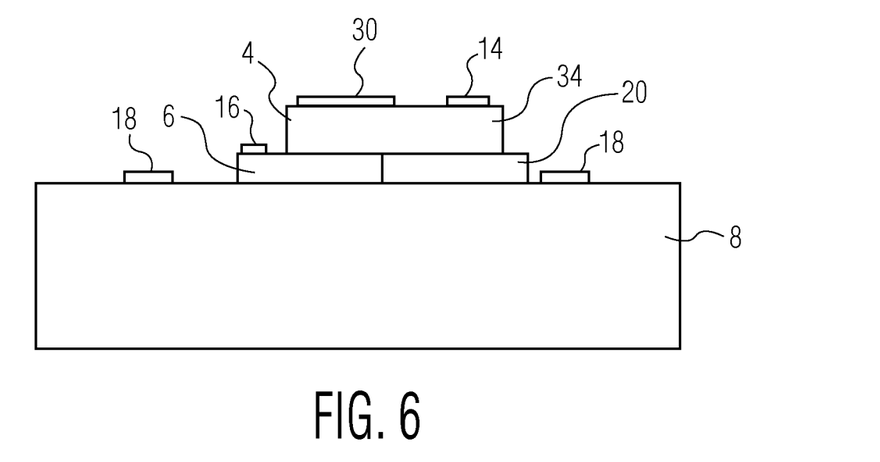
FIG. 6 shows a semiconductor device including a bipolar transistor according to a further embodiment of the invention.

FIG. 6 illustrates a semiconductor device according to a further embodiment of the invention. In this embodiment, the device includes a similar construction to that described above in relation to FIGS. 2 to 5. Thus, the emitter 8 is formed in the bulk of a semiconductor substrate, and the base 6 and collector 4 are provided as patterned layers located on a major surface of the substrate. In addition, in this embodiment, the collector 4 is provided with a collector gate 30.

The purpose of the collector gate 30 is to shape the electric field within the collector 4. In this way, the peak electric field within the collector 4 can be suppressed, thereby improving still further the breakdown voltage of the device. While field shaping of this kind is known, it is proposed here for the first time to implement the use of a collector gate in a bottom up bipolar transistor having a lateral collector.

The collector gate 30 can include a gate electrode isolated from the collector 4 by a dielectric. The dielectric and gate electrode can be provided in the form of a stack of layers, as is known from, for example, the manufacture of gates for field effect devices such as MOSFETs. In some embodiments, the thickness of the gate dielectric can be varied laterally along the collector, whereby the impact of the gate on the electric field within the collector can be tailored as a function of position.

In some alternative examples, a "non-dielectric-isolated" gate can be provided, comprising a pn junction between the material of the gate electrode and the material of the collector. Such a gate can be used for field shaping.

The collector gate 30 can, in some examples, be connected to another terminal of the device. For example, the collector gate 30 can be connected to the emitter 8.

The location, size and shape of the collector gate 30 on the collector 4 can be chosen to optimise the field shaping effect. For example, in the present embodiment, the collector gate 30 is positioned at an end of the laterally extending collector 4 proximal the interface between the collector 4 and the base 6. The electric field within the collector 4 is typically highest in the region proximal the base 6, and hence a gate 30 located close to this region is well placed to suppress the peak in electric field.

In this example, the collector gate 30 is located on an upper surface of the collector 4. This arrangement is relatively simple to process during manufacture, since the upper surface of the collector 4 is made easily accessible by virtue of the fact that the collector 4 is at the top of the device.

In other embodiments, it is envisaged that the collector 4 can be at least partially enclosed within the collector gate 30. For example, the collector 4 may comprise an elongate portion extending through the collector gate 30. In some examples, the collector 4 and the collector gate 30 may have a coaxial configuration, in which the collector gate 30 is wrapped around the collector 4.

Simulations of field strength with the device can be used to predict where the peak(s) in local internal field are likely to occur, thereby to determine the optimal position and size of the gate 30. In some embodiments, the gate can be split into a plurality of separate portions and biased separately, allowing closer control of the local internal field.

Figure 7:
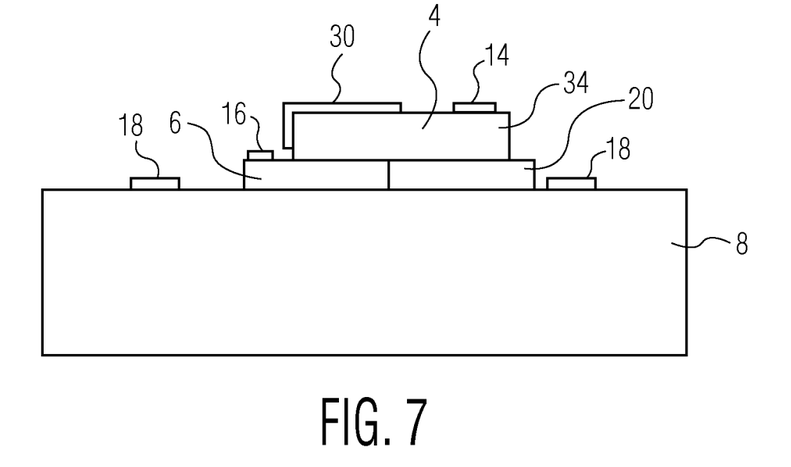
FIG. 7 shows a semiconductor device including a bipolar transistor according to another embodiment of the invention.

FIG. 7 illustrates a semiconductor device according to another embodiment of the invention. Since a device according to embodiments of this invention includes a collector at the "top", the surface of the collector is made generally accessible such that there is considerable freedom for selecting the appropriate location and configuration of the collector gate 30. In this embodiment, for example, it is illustrated that the collector gate 30 can at least partially cover more than one surface of the collector 4. The collector gate 30 may, for example, wrap around the sides of the collector 4, thereby increasing the surface area over which it can influence the internal field within the collector 4.

In the present example it is shown that the collector gate 30 at least partially covers an upper surface and one or more sidewalls of the collector 4. By covering the parts of the side walls of the collector 4 proximal the base 6, the field shaping effect of the gate 30 can be increased, as noted above. Also as noted above, the collector gate may be divided into a series of interconnected sub gates, each covering a portion (e.g. a respective surface) of the collector 4.

The materials used to form the elements (particularly the emitter, base and collector) of the devices disclosed herein can be selected in accordance with the desired device characteristics. It is noted that in some embodiments, the collector 4 can be formed from a different material to that used for the base. In one example of such a heterojunction transistor, the collector can comprise a III-V material such as GaAs or alternatively GaN, which has a high critical breakdown field.

In some examples, the collector can include different layer stacks or can include local implants or spikes to improve, for example, the breakdown versus $f_T$ trade-off. Features of this kind are known in conventional devices, but it is envisaged that they can be easier to implement in the case of a device in which the collector is located above the base and emitter.

It is noted that since the collector of the devices disclosed herein is located above the base, a different material and/or structural configuration can readily be selected for use in the collector without the need to substantially alter the design of the rest of the device or the process steps used to produce it. Moreover, since the current driving the base-emitter junction is beneath the collector, modifications to the collector do not necessarily affect the electrical characteristics of the base-emitter junction. In contrast, in conventional bipolar transistors in which the collector is located at the bottom of the device (e.g. formed in the substrate), changing the material used for the collector has wide ranging implications for the overall design. Again therefore, the provision of a bottom up bipolar transistor with a lateral collector in accordance with an embodiment of this invention can increase the freedom available to the device designer with regard to the materials chosen for the collector, while also simplifying the processing steps required for manufacture.

Figure 8:
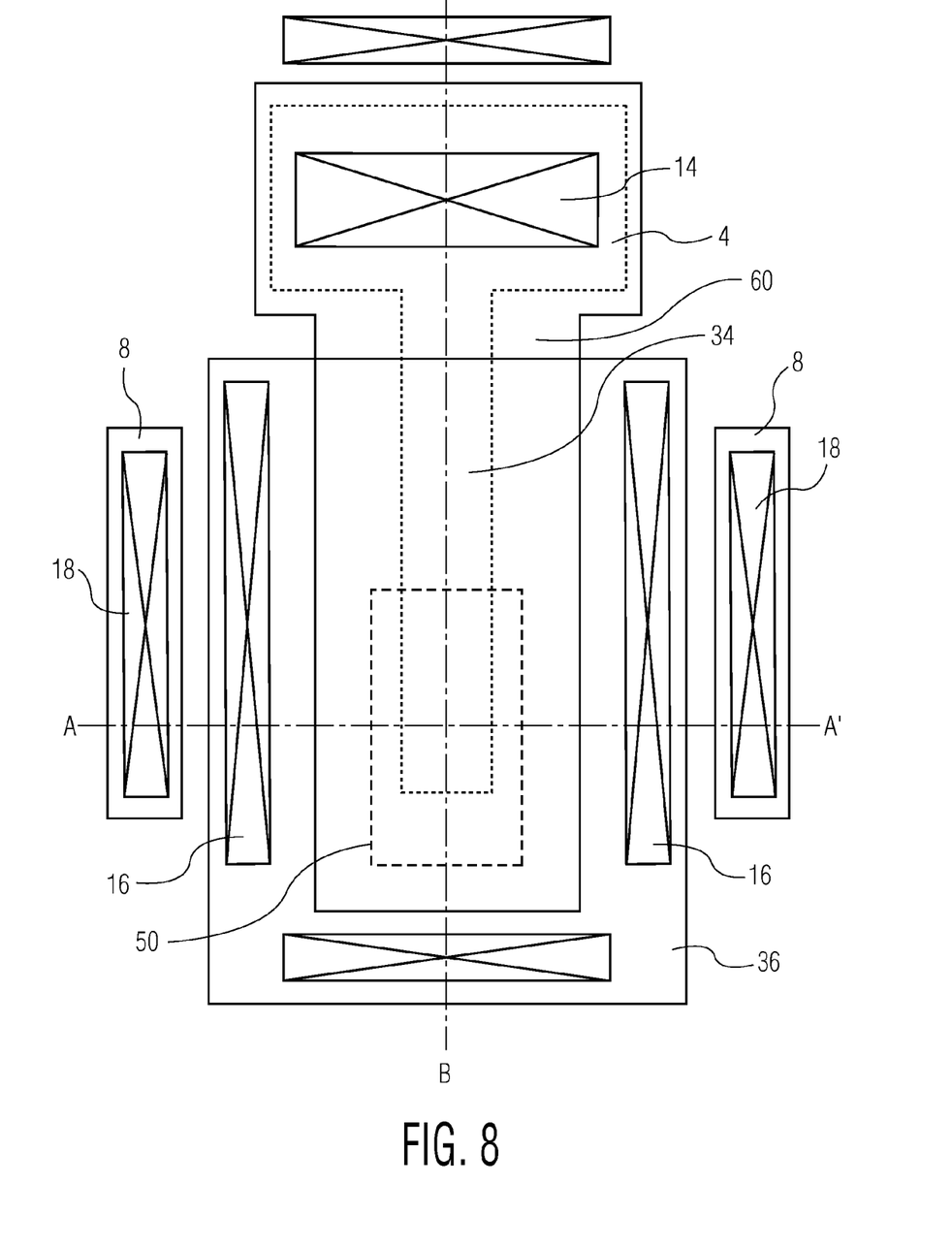
FIG. 8 shows a semiconductor device including a bipolar transistor according to a further embodiment of the invention.
Figure 9A:
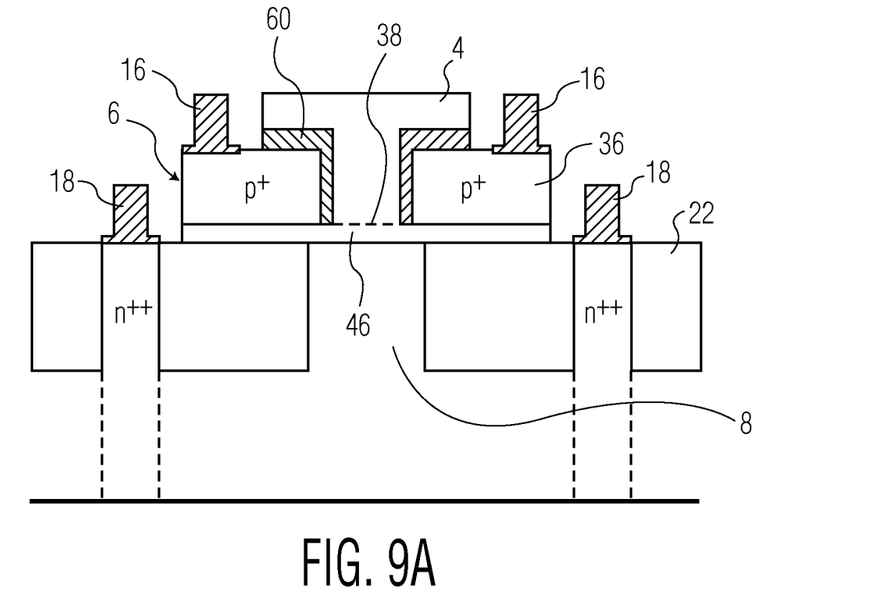
FIGS. 9A and 9B show cross sections of the device of FIG. 8.
Figure 9B:
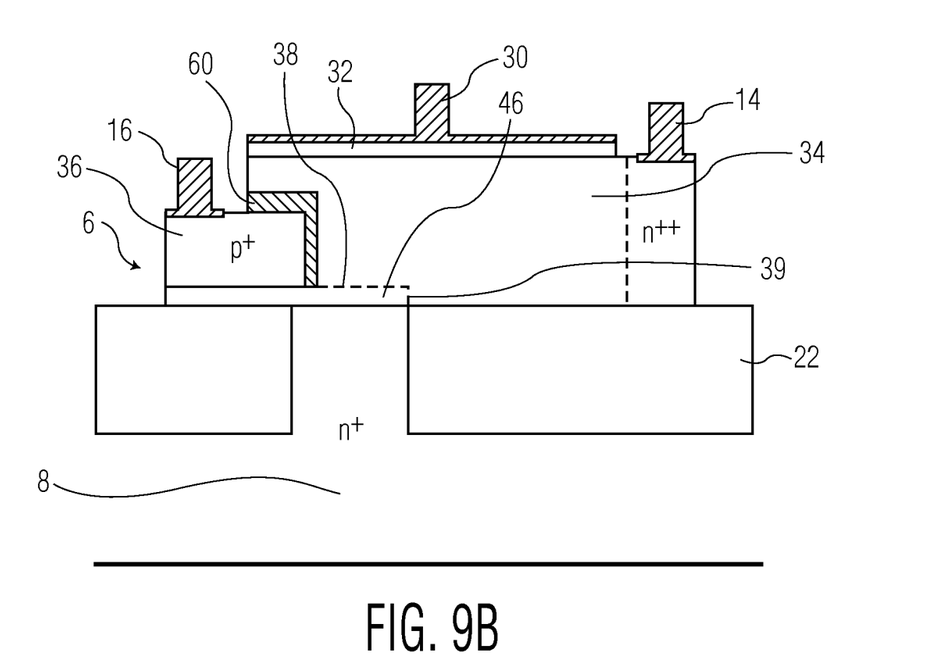

FIG. 8 illustrates a semiconductor device according to a further embodiment of the invention. FIG. 9A shows a cross section of this embodiment along the line AA' in FIG. 8, while FIG. 9B shows a cross section of this embodiment along the line BB' in FIG. 8. The present embodiment combines a number of the features described in respect of the previous embodiments.

The emitter 8 in this example is formed in a semiconductor substrate, either in a well-like portion or in the bulk of the substrate. The emitter can, for example, comprise SiGe, allowing a high cut off frequency $f_T$.

Also in this example, a number of dielectric filled cavities 22 are used to delimit the spatial extent of the emitter 8, thereby to define the contact area between the emitter 8 and the base 6 and to form regions to which the emitter contacts 18 can be made as illustrated in FIG. 9A. The contact regions of the emitter 8 can be relatively highly doped (e.g. $n^{++}$ in the case of an npn device as shown in FIG. 9A) to improve the quality of the contact. Additionally, the doping profile of the emitter can be chosen such that the emitter-base junction, which is the current driving junction in a bipolar device, is optimised to reach a high cut off frequency $f_T$.

The base 6 in this example includes two parts. A first part comprises a base intrinsic region 46. The base intrinsic region in 46 this example comprises part of a semiconductor layer that extends between a portion of the emitter 8 that is exposed at the major surface of the substrate (the edges of this portion are defined by the surrounding isolation regions 22) and the overlying collector 4. In this example, the layer forming the intrinsic region 46 also extends into the extrinsic region 36 described below. The base intrinsic region 46 can, for example, comprise SiGe. The active region 50 of the device, which is illustrated by the dotted rectangle shown in FIG. 8, can be loosely defined as the area of contact or overlap between the emitter 8, the base intrinsic region 46 and the overlying collector 4. A second part of the base 6 comprises an extrinsic region 36. The extrinsic region 36 can, for example, comprise polysilicon. The extrinsic region 36 is located adjacent the base intrinsic region 46, and at least partially surrounds the active region 50. The extrinsic region 36 is thereby well positioned to inject carriers into the active region 50, and the base resistance of the device is correspondingly low. One or more base contacts 16 connect to the extrinsic region 36. In this example, the base contact(s) 16 make their connections to an upper surface of the extrinsic region 36, however it is envisaged that they may also extend over the side walls of the extrinsic region 36.

From comparison of FIGS. 8, 9A and 9B, it can be seen that the extrinsic region 36 in this example is substantially U-shaped. This configuration can be produced using lithographic masking and etching techniques. The centre part of the U-shaped extrinsic region 36 receives a part of the collector 4 which makes contact with the exposed base intrinsic region 46. This central part of the collector 4 also rests upon an upper surface of the isolation regions 22. A part of the collector 4 can also partly lies on top of the extrinsic region 36 (as is most clearly viewed in FIGS. 9A and 9B). The collector 4 in this embodiment is thus T-shaped in cross section. To isolate the extrinsic region 36 from the collector 4, a layer of oxide 60 (such as a standard spacer of the kind that is well known in the art of semiconductor manufacturing) can be provided on the extrinsic region 36 before the collector 4 is formed. The spacer 60 can be seen in dross sections in FIGS. 9A and 9B, and is also indicated by a dotted line in FIG. 8. Contact between the collector 4 and the base is thereby made only at an upper part of the base intrinsic region 46, as illustrated by the dotted line 38 in FIGS. 9A and 9B).

The collector 4 extends laterally, past an edge 39 of the base intrinsic region 46 (see FIG. 9B). As noted above, the provision of a laterally extending region 34 of the collector 4, which extends away from the base 6 in this way, allows the electric field within the collector 4 to be spread out, therefore improving the breakdown characteristics of the device. The collector contact 14 in this example is located at an end of the laterally extending collector 4 that is distal the base 6. The collector contact 14 is conveniently made to the upper surface of the laterally extending region 34 of the collector 4, but may also extend over other surfaces of the collector 4 (e.g. the side walls thereof). A contact region of the collector 4 near to the collector contact 14 can be relatively highly doped (e.g. see the $n^{++}$ region of the collector 4 indicated in FIG. 9B) to improve the quality of the contact.

In the present embodiment, the device further includes a collector gate. The collector gate includes a gate electrode 30 that is isolated from the collector 4. The collector gate in this example is located at an end of the collector 4 that is proximal the base 6. For clarity, the collector gate is shown here only in FIG. 9B. In FIG. 9B it can be seen that the collector gate in this embodiment is located over a substantial portion of the collector 4. The collector gate can cover, for example, the entire footprint of the active region 50 of the device as projected onto an upper surface of the collector. The collector gate can also extend along the laterally extending portion 34 of the collector towards the collector contact 14. The collector gate may also extend over the side walls of the collector 4, for example on the laterally extending portion 34. By enveloping the collector 4 in this way with the collector gate, the field shaping effect of the collector gate can be optimised.

Accordingly, there has been described a semiconductor device and a method of making the same. The device includes a semiconductor substrate. The device also includes a bipolar transistor on the semiconductor substrate. The bipolar transistor includes an emitter. The bipolar transistor also includes a base located above the emitter. The bipolar transistor further includes a laterally extending collector located above the base. The collector includes a portion that extends past an edge of the base.

Although particular embodiments of the invention have been described, it will be appreciated that many modifications/additions and/or substitutions may be made within the scope of the claimed invention.

The invention claimed is:
1. A semiconductor device comprising:
a semiconductor substrate, and
a bipolar transistor on the semiconductor substrate, the bipolar transistor comprising:
an emitter formed in the substrate;
a base located above the emitter, and
a laterally extending collector located above the base, wherein the collector includes a collector portion that extends past an edge of the base,
wherein the emitter extends laterally beyond the collector portion.

2. The device of claim 1 comprising a dielectric located between the collector portion that extends past an edge of the base and the emitter.

3. The device of claim 1, wherein the bipolar transistor has a layered structure in which:
the base comprises a patterned layer of semiconductor material located on the emitter, and
the collector comprises a patterned layer of semiconductor material located on the base.

4. The device of claim 1 comprising one or more dielectric filled cavities located in the emitter for reducing the base-emitter capacitance of the bipolar transistor.

5. The device of claim 1 comprising a collector gate for shaping an electric field in the collector.

6. The device of claim 5, wherein the gate is located at an end of the laterally extending collector proximal the base.

7. The device of claim 5, wherein the gate is at least partially enclosed within the collector.

8. The device of claim 5, wherein the gate at least partially covers more than one surface of the collector.

9. The device of claim 5, wherein the gate is at least partially located on an upper surface of the collector.

10. The device of claim 9, wherein the gate at least partially covers each of an upper surface and one or more sidewalls of the collector.

11. The device of claim 1 comprising a collector contact at an end of the laterally extending collector distal the base.

12. The device of claim 1 comprising a base contact portion that at least partially covers each of an upper surface and one or more sidewalls of the base.

13. The device of claim 1, wherein the bipolar transistor is a heterojunction bipolar transistor in which the collector comprises a different semiconductor material to the base.

14. The device of claim 13, wherein the collector comprises GaN.

15. A method of making a semiconductor device, the method comprising:
providing a semiconductor substrate, and
forming a bipolar transistor on the substrate by:
forming an emitter of the bipolar transistor in the semiconductor substrate;
forming a base located above the emitter, and
forming a laterally extending collector located above the base, wherein the collector includes a collector portion that extends past an edge of the base,
wherein the emitter extends laterally beyond the collector portion.

16. A semiconductor device, comprising:
a semiconductor substrate;
at least one isolation region disposed within the semiconductor substrate; and
a bipolar transistor disposed on the semiconductor substrate, the bipolar transistor comprising:
an emitter formed in the substrate;
a base located above the emitter and above one of the at least one isolation regions, and
a laterally extending collector located above the base and emitter, wherein the collector includes a collector portion that extends past an edge of the base, and
wherein the emitter extends laterally beyond the collector portion.

17. The semiconductor device of claim 16, wherein the isolation regions include a dielectric material.

18. The semiconductor device of claim 16, wherein the laterally extending collector is disposed above two of the plurality of isolation regions.

19. The semiconductor device of claim 16, comprising:
at least one emitter contact region formed within at least one of the plurality of isolation regions.

20. The semiconductor device of claim 16, wherein the collector is disposed above a plurality of isolation regions.

* * * * *